(12) United States Patent
Rabinovitch et al.

(10) Patent No.: US 10,380,310 B2
(45) Date of Patent: Aug. 13, 2019

(54) METHOD AND APPARATUS FOR EMULATION AND PROTOTYPING WITH VARIABLE CYCLE SPEED

(71) Applicant: Synopsys, Inc., Mountain View, CA (US)

(72) Inventors: Alexander Rabinovitch, Marlboro, MA (US); Cedric Alquier, Wissous (FR)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/975,572

(22) Filed: Dec. 18, 2015

(65) Prior Publication Data

US 2016/0103947 A1   Apr. 14, 2016

Related U.S. Application Data

(63) Continuation of application No. 14/300,165, filed on Jun. 9, 2014, now Pat. No. 9,244,795.

(60) Provisional application No. 61/896,548, filed on Oct. 28, 2013.

(51) Int. Cl.
  *G06F 17/50*     (2006.01)
  *G06F 11/273*    (2006.01)
  *G06F 11/26*     (2006.01)

(52) U.S. Cl.
  CPC ........ *G06F 17/5081* (2013.01); *G06F 11/261* (2013.01); *G06F 11/273* (2013.01)

(58) Field of Classification Search
  USPC ....................................................... 716/113
  See application file for complete search history.

(56) References Cited

U.S. PATENT DOCUMENTS

| 4,764,687 A * | 8/1988 | Hamilton | G06F 1/14 327/141 |
|---|---|---|---|
| 2002/0120896 A1* | 8/2002 | Wang | G01R 31/31704 714/731 |
| 2003/0100956 A1* | 5/2003 | Peck | G05B 19/40 700/14 |
| 2008/0072025 A1* | 3/2008 | Staszewski | G06F 9/30032 712/241 |
| 2008/0315928 A1* | 12/2008 | Waheed | G04F 10/005 327/159 |
| 2011/0012686 A1* | 1/2011 | Ruffieux | H03L 1/026 331/116 R |
| 2012/0047412 A1* | 2/2012 | Chung | G01R 31/31727 714/731 |
| 2012/0047481 A1* | 2/2012 | Ficke | H03L 7/099 716/138 |
| 2014/0075257 A1* | 3/2014 | Wang | G06F 17/5045 714/731 |

(Continued)

Primary Examiner — Mohammed Alam
(74) Attorney, Agent, or Firm — Alston & Bird

(57) ABSTRACT

A hardware verification system includes, in part, a multitude of programmable devices and a system clock. The hardware verification system receives a circuit design and generates a variable period clock from the system clock by analyzing propagation delays in different signal paths of the circuit design. The variable period clock has a first period that occurs in each N cycles of the system clock and a second period that occurs in each M cycles of the system clock, in which M>N. The variable period clock is applied to at least one of the programmable devices to verify the circuit design.

23 Claims, 6 Drawing Sheets

(56) References Cited

U.S. PATENT DOCUMENTS

2015/0121138 A1\* 4/2015 Rabinovitch ......... G06F 11/273
                                                                    714/28

\* cited by examiner

METHOD AND APPARATUS FOR EMULATION AND PROTOTYPING WITH VARIABLE CYCLE SPEED

CROSS-REFERENCES TO RELATED APPLICATIONS

This application is a continuation application of U.S. application Ser. No. 14/300,165, filed Jun. 9, 2014, entitled "METHOD AND APPARATUS FOR EMULATION AND PROTOTYPING WITH VARIABLE CYCLE SPEED," which claims priority, under 35 U.S.C. § 119(e), to U.S. Provisional Application No. 61/896,548, filed Oct. 28, 2013, entitled "METHOD AND APPARATUS FOR EMULATION AND PROTOTYPING WITH VARIABLE CYCLE SPEED," the contents all of which are incorporated herein by reference in their entirety.

TECHNICAL FIELD

The present invention relates generally to testing a hardware design, and more specifically to testing such hardware using a hardware emulation tool.

BACKGROUND

Integrated circuit (IC) designers commonly describe their designs in HDL (hardware description language) such as Verilog, VHDL, SystemC, and the like. In IC design, hardware emulation may refer to the process of replicating the behavior of one or more pieces of hardware (typically a design under test) with another piece of hardware, typically a special-purpose emulation system. An emulation model is usually based on a hardware description language source code, which is compiled into the format used by emulation system. The goal is debugging and functional verification of the system being designed. Overall progress of the emulation is usually controlled by a clock signal generated on the emulator hardware.

In general, multiple types of clocks, such as a system clock, design clock, derived clocks and the like may exist in an emulation system. The system clock (that may also be referred to as an atomic clock) is the most frequent clock of the emulation system. Primary clock of a design (that may also be referred to as a design clock) is the fastest clock signal that can be used to execute the design. Behavior of the primary clock is usually defined in terms of number of system clock cycles. The derived clocks may be derived from the design clock using, for example, combinational logic.

Modern hardware designs exhibit complex clock trees. For example, a derived clock may be generated by gating and/or dividing the design clock, or multiplexing one or more clock signals. In general, evaluation of a primary clock cycle in the design involves evaluation of values of multiple clock signals that are derived from the primary clock. For example, in order to find the fastest clock signal that can be used to execute a design, the primary clock signal and all the other clocks that are derived from the primary clock signal are analyzed and the longest propagation delay in the design is identified. Based on the longest propagation delay, frequency of the design clock is determined.

In a typical emulation, each evaluation that corresponds to propagation of a primary clock in the design (so that values of the derived clock can be established) takes the same number of the system clock cycles (e.g., atomic clock cycles) of the emulation board. However, when a derived clock does not change value for a given new value of the primary clock, same number of system clock cycles are waited to propagate the derived clock even if the value of the derived clock does not change.

SUMMARY

A hardware verification system according to one embodiment includes, in part, multiple programmable devices and a system clock. The hardware verification system is configured to generate a variable period clock signal from the system clock. The hardware verification system then applies the variable period clock signal to at least a first subset of the programmable devices.

In one embodiment, the variable period clock signal has a first period and a second period greater than the first period. The first period occurs during each N cycles of the system clock and the second period occurs during each M cycles of the system clock. N and M are integer values greater than zero. In one embodiment, the hardware verification system further includes, in part, computer instructions that receive a circuit design and determine the second period based on a propagation delay of a signal path of the circuit design.

In one embodiment, the hardware verification system identifies a first propagation delay associated with a first signal path corresponding to propagation of a first clock signal derived from the variable period clock signal. In addition, the hardware verification system identifies a second propagation delay associated with a second signal path. The hardware verification system applies the second period of the variable period clock signal when a change in value of the first clock signal is expected at a next edge of the system clock, and applies the first period of the variable period clock signal when a change in value of the first clock signal is not expected at the next edge of the system clock. In one embodiment, the second period of the variable period clock signal is defined in accordance with the first propagation delay. And, the first period of the variable period clock signal is defined in accordance with the second propagation delay. In one embodiment, the first propagation delay corresponds to a maximum clock propagation delay in a circuit design. In addition, the second propagation delay is smaller than the first propagation delay and larger than any other clock propagation delay in the circuit design.

According to one embodiment, the hardware verification system identifies a first propagation delay associated with a first signal path that receives the variable period clock signal, and identifies a second propagation delay associated with a second signal path that receives the variable period clock signal. The first signal path supplies a first input of a multiplexer circuit and the second signal path supplies a second input of the multiplexer circuit. The hardware verification system applies the first period of the variable period clock signal when the first input of the multiplexer circuit is selected, and applies the second period of the variable period clock signal when the second input of the multiplexer circuit is selected. In one embodiment, the first period of the variable period clock signal is defined in accordance with the first propagation delay and the second period of the variable period clock signal is defined in accordance with the second propagation delay.

In one embodiment, the hardware verification system is a hardware emulator. In one embodiment, the hardware verification system includes an array of field programmable gate arrays.

The hardware verification system in one embodiment includes, in part, processor instructions to receive a circuit design and to determine one or more periods of the variable period clock signal based on propagation delays of one or more signal paths of the circuit design. The hardware verification system according to one embodiment significantly reduces the time that takes to verify a circuit design by adapting to a shorter period when there is no change in a clock corresponding to a signal path of the circuit design with a relatively long propagation delay, and adapting to a longer period when a change in the clock signal is to be propagated through the signal path with the relatively long propagation delay.

In one embodiment, an apparatus for verifying a design using a plurality of programmable devices is disclosed. The apparatus includes, in part, means for causing a variable period clock signal to be generated from a system clock when the design is received by the plurality of programmable devices. The variable period clock has a first period and a second period greater than the first period. The first period occurs in each N cycles of the system clock and the second period occurs in each M cycles of the system clock. N and M are integer values greater than zero. The apparatus further includes means for applying the variable period clock signal to at least a first one of the plurality of programmable devices to verify the design.

A better understanding of the nature and advantages of the embodiments of the present invention may be gained with reference to the following detailed description and the accompanying drawings.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Certain embodiments of the present invention verify operation of a circuit (e.g., design under test (DUT)) by generating a variable period clock signal and analyzing the circuit using the variable period clock signal. The variable period clock signal may have two or more periods corresponding to different cycles. As an example, the variable period clock may have two different periods (e.g., $T_1$ and $T_2$), in which one of the periods is greater than the other (e.g., $T_2 > T_1$). The longer period (e.g., $T_2$) may occur in each N cycles of the shorter period (e.g., $T_1$), where N is an integer greater than zero. In one embodiment, the periods may be defined based on the propagation delays of different signals. The variable period clock signal may be applied to an emulation board which includes one or more programmable processors, such as Field programmable gate arrays (FPGAs). These programmable processors may then be programmed to execute the DUT and verify its operation.

The term system clock (e.g., sys_clk) or an atomic clock is understood to refer to a primary clock signal on an emulation board or prototype board. In addition, the term design clock is understood to refer to the clock signal that is determined for the DUT, based on properties of the circuit.

Figure 1:
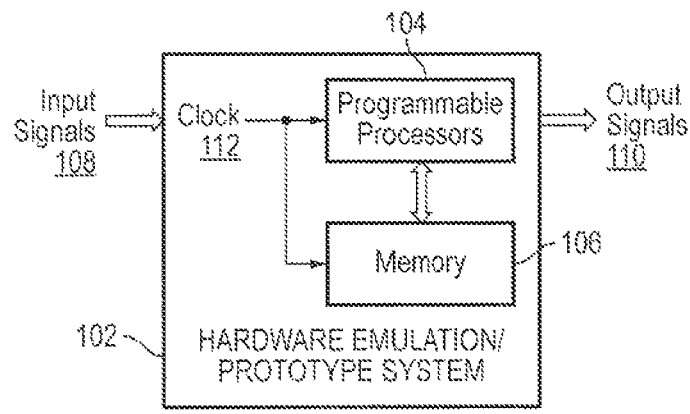
FIG. 1 is an exemplary high level block diagram of a hardware emulator or prototype board, in accordance with some embodiments of the present invention.

FIG. 1 is an exemplary high level block diagram of a hardware emulator or prototype system 102 that can be used to verify, test or debug a circuit design. As illustrated, the hardware emulation/prototype system 102 may include a multitude of programmable processors 104 (e.g., FPGAs), a memory 106, and other blocks (not shown). The hardware emulation/prototype system receives input signals 108 and generates output signals 110. The programmable processors 104 are programmed to verify behavior of a circuit. System 102 may include a primary system clock 112 from which a number of other clock signals can be generated. For example, the primary clock may be divided by one or more numbers to generate clocks having lower frequencies. The design code, instructions, and data may be stored in memory 106.

In general, a hardware design operates at a granularity of clock cycles. Therefore, when mapped onto an emulation tool, conventionally, equal number of system clock cycles is used to execute every single cycle of the design under test (hereinafter DUT). Some cycles of hardware design are emulated using faster clocks, as described below, in accordance with embodiments of the present invention.

Generally, a system clock may be divided into multiple, less frequent clocks (e.g., divided clocks). As an example, a system clock may be divided by N to generate a divided clock, in which N is a positive integer.

Figure 2:
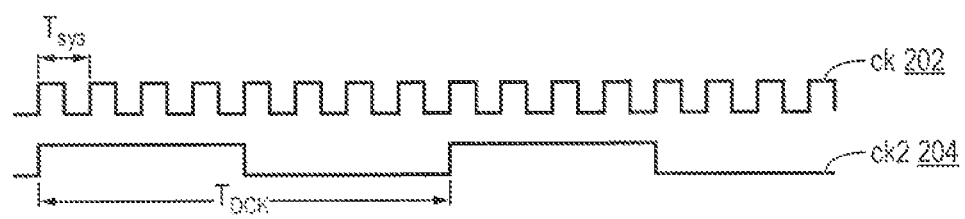
FIG. 2 illustrates two exemplary clock signals, in accordance with some embodiments of the present invention.

FIG. 2 illustrates two exemplary clock signals (a system clock ck 202 and a divided clock ck2 204). The system clock 202 has a period $T_{sys}$ and the divided clock has a period $T_{DCK}$. In this example, the divided clock is assumed to be generated by dividing the frequency of the system clock by 8. Therefore, period $T_{DCK}$ of the divided clock 204 is eight times larger than period $T_{sys}$ of the system clock 202. In one embodiment, the divided clock ck2 may be defined with the following pseudo-code:

```
bit [1:0] cnt = 0;
bit ck2 = 0;
always @(posedge ck) begin
    if (cnt == 0) ck2 = ~ ck2;
    cnt++;
end
``` in which at every 8-th positive edge (e.g., posedge) of ck, there is a positive edge of ck2.

Generally, building blocks (e.g., logic gates) of a DUT, may be sensitive to positive edge (rising edge), negative edge or both positive and negative edges of a clock signal. Without loss of generality, it is assumed that building blocks of the DUT are sensitive to positive edges of the clock signal.

The exemplary embodiment of the present invention is described with reference to an example in which the ratio between the frequencies of the system clock and the divided clocks is 8:1. It is understood that embodiments of the present invention apply to any ratio N:M of the divided clock to the system clock, in which N and M are integer numbers.

Figure 3:
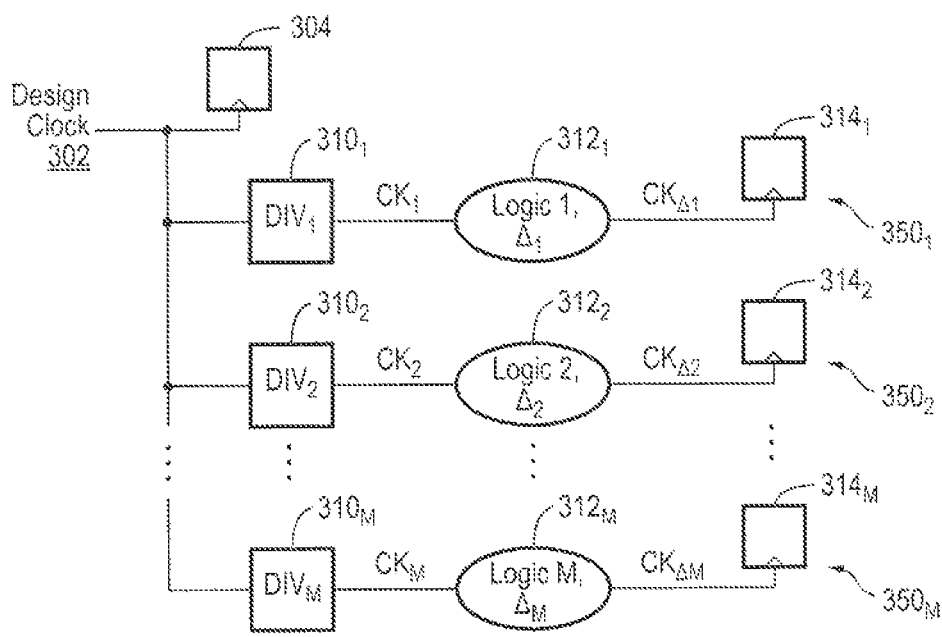
FIG. 3 illustrates an exemplary circuit block diagram, shown as including multiple signal paths, according to one embodiment of the present invention.

FIG. 3 is an exemplary circuit block diagram, shown as including M signal paths $350_1$ through $350_M$. In this example, design clock 302 is shown as being directly applied to block 304 (e.g., a flip flop). In addition, M dividers $DIV_1$ $310_1$ through $DIV_M$ $310_M$ are shown as dividing the design clock by different integer values to generate less frequent clocks $ck_1$ through $ck_M$. For example, divider $DIV_1$ $310_1$ divides the design clock by $N_1$ to generate a divided clock signal $ck_1$. Similarly, divider $DIV_2$ $310_2$ divides the design clock by $N_2$ to generate a divided clock signal $ck_2$, and divider $DIV_M$ $310_M$ divides the design clock by $N_M$ to generate a divided clock signal $ck_M$.

The divided clock signal $ck_1$ is shown as passing through logic block $312_1$ before being applied to sequential logic $314_1$. Accordingly, there is a delay (e.g., $\Delta_1$) between clock signals $ck_1$ and $ck_{A1}$. The propagation delays across blocks $312_1$, $312_2$, and $312_M$ are shown as being equal to $\Delta_1$, $\Delta_2$, $\Delta_M$, respectively. It is understood that a circuit may include any number of signal paths.

Conventionally, every design cycle in emulation takes the amount of time necessary for the evaluation of the cycle of the least frequent divided clock, which may correspond to the longest propagation delay in the design. For example, in the example illustrated in FIG. 3, if $\Delta_1 < \Delta_2 \ldots < \Delta_M$, the design clock is conventionally defined such that the clock (e.g., $ck_{AM}$) that passes through the longest propagation delay (e.g., $\Delta_M$), has enough time to propagate through its associated logic block $312_M$. Therefore, every cycle of the design clock is conventionally selected to be long enough to enable propagation of a change in the $ck_{AM}$ corresponding to the path with the longest delay. However, according to one embodiment of the present invention, the design clock is selected to be long enough for the propagation of the longest delay path during only every $N_M$ cycles (e.g., to allow for propagation of a change in the clock through the logic associated with it). As a result, the design clock is selected to have $N_M$-1 short cycles and one long cycle during every $N_M$ cycles. A design clock so selected is referred to herein as a variable period clock.

In one embodiment, if $N_M$=8, the variable period clock signal may have 7 short cycles and one long cycle to allow for the propagation of clock $ck_{AM}$ through logic $312_M$. As a result, in the cycles in which value of the divided clock $ck_{AM}$ does not change, there is no need to slow down the emulation speed. Since the divided clock changes only once in every $N_M$ cycle of the design clock in the above example, using the variable period clock, in one embodiment, provides up to $N_M$ times acceleration in emulation speed of the design. For example, the design clock may have a first period equal to $TD_1$ and a second period equal to $TD_2$. Both $TD_1$ and $TD_2$ may be multiples of the period of the system clock. Therefore, number of system clock cycles necessary to evaluate a full cycle of the design may be different for different cycles of the design clock.

Figure 4:
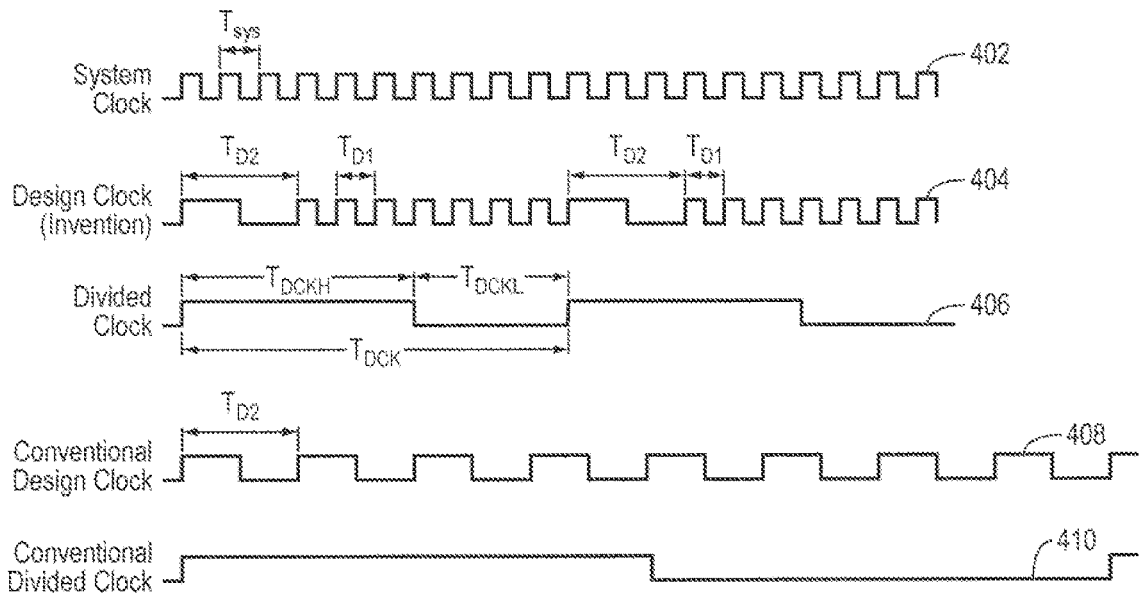
FIG. 4 illustrates exemplary clock signals in a system, according to one embodiment of the present invention.

FIG. 4 illustrates exemplary clock signals in a system, according to one embodiment. System clock 402 is shown as having a period of $T_{sys}$. The design clock 404 has a variable period (e.g., two different periods $TD_1$ and $TD_2$). As described above, in one embodiment, $TD_2$ may be longer than $TD_1$. It is understood that the design clock 404 may have any number of different periods that may appear at different cycles. For example, during some cycles, design clock 404 may have a first period TD1; during other cycles, design clock 404 may have a second period TD2; yet during other cycles, the design clock may have a third period TD3. It is understood that a design clock, in accordance with the present invention, may have any number of differing periods occurring in any predefined sequence.

Also shown in FIG. 4 is a clock signal 406 generated by dividing design clock 404 by 8. Since the design clock 404 has different periods for different cycles, $TDCK_H$ and $TDCK_L$ may have unequal lengths. In this example, period of the divided clock 406 is defined as follows:

$$T_{DCK} = TD_2 + (N_M - 1)TD_1.$$

It is understood that conventionally, the design clock has $N_M$ long cycles corresponding to one cycle of the divided clock (as shown in conventional design clock 408), which could take $N_M \times TD_2$ seconds. However, as described above, the time corresponding to one cycle of the divided clock may be reduced to $TD_2 + (N_M - 1)TD_1$ seconds. As an example, if the short cycle is ⅓ of the long cycle (e.g., $TD_2 = 3 \times TD_1$) and $N_M = 8$, one embodiment reduces the time corresponding to each cycle of the divided clock 406 by a factor of $10/24^{th}$ compared to conventional approach (e.g., conventional divided clock 410). As a result, emulation time of the DUT is reduced by a factor of $10/24^{th}$. If the ratio between periods of the long cycle and the short cycle is larger (e.g., $TD_2 = 16 \times TD_1$), emulation time may be reduced more dramatically, which results in faster emulation speed.

Figure 5:
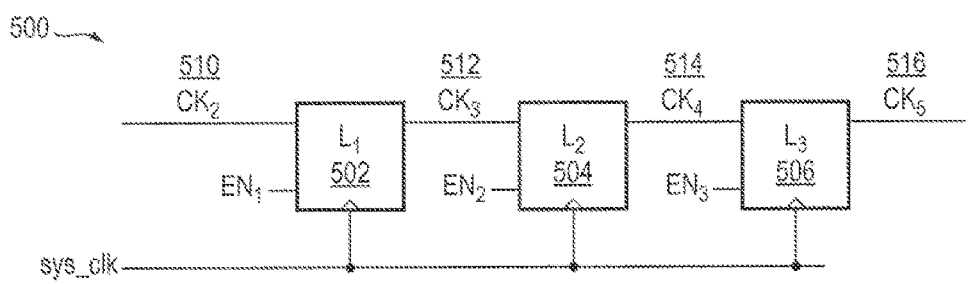
FIG. 5 illustrates an exemplary logic block for generating multiple clock signals in a design, according to one embodiment of the present invention.

FIG. 5 illustrates an exemplary logic block 500 for generating multiple clocks in a design. As an example, logic block 500 corresponds to block $312_2$ in FIG. 3 and clock ck5 516 corresponds to clock $ck_{A2}$ in FIG. 3. A gated clock signal ck3 512 is derived from clock signal ck2 510. In addition, another gated clock signal ck4 514 is derived from clock signal ck3, and clock signal ck5 516 is derived from clock signal ck4. In this example, blocks 502, 504 and 506 represent three different logic gates. The relationship between these clocks is shown as follows:

ck3=ck2 & en1,
ck4=ck3 & en2,
ck5=ck4 & en3.

in which en1, en2 and en3 are three enabling signals. In this example, full evaluation of the clocks derived from ck2 510 could take up to three clock cycles of sys_clk 402 (due to time necessary to evaluate each of the intermediate clock signals). In FIG. 5, changes in ck2 take one cycle to propagate through each of the gates 502, 504 and 506. Therefore, a change in ck2 is propagated to ck5 in three cycles. In the above example, if ck2 is generated by dividing the design clock by N, every $N^{th}$ cycle of the design clock should be long enough for propagation of the gated clock signals (e.g., ck3, ck4 and ck5). This is because there is a positive edge on ck2 only every N cycles of sys_clk (which needs to be propagated through each of the gates 502, 504 and 506).

By using a variable period clock, according to one embodiment, every $N^{th}$ cycle of the design clock has a long period (e.g., $TD_2$) and other cycles of the design clock have a short period (e.g., $TD_1$). As an example, as shown in FIG. 4, the long period $TD_2$ is equal to $3 \times T_{sys}$, and the short period $TD_1$ is equal to $T_{sys}$. For this example, evaluation of K cycles of the design clock is performed in (⅞)*K*1+(K/8)*3=K*(⅞+⅜)=1.25K cycles of sys_clk, as compared to 3K cycles that may be needed conventionally. Accordingly, a 2.4× improvement in emulation time is achieved.

In general, if a divided clock is derived from the design clock with a factor of N, according to one embodiment, evaluation of K cycles of the design clock is performed in $$K\left(\frac{(N-1)}{N} \times N_{D1} + \frac{1}{N} \times N_{D2}\right)$$

cycles of sys_clk, in which $$N_{D1} = \frac{T_{D1}}{T_{sys}} \text{ and } N_{D2} = \frac{T_{D2}}{T_{sys}}.$$

In one embodiment, a circuit may be configured to determine propagation delays associated with the design clock and its respective divided clocks (e.g., ck2, etc.). When no divided clock edges are detected, the period of the design clock is adjusted to account for the propagation of the design clock through all the paths under consideration. When an edge is detected on the divided clock, duration of the design clock is set based on the propagation delay of the divided clock. As a result, the design clock may have a short period corresponding to a signal path with a relatively short propagation delay, and a relatively long period corresponding to another signal path with a relatively long propagation delay. In general, the variable period clock signal may have any number of different periods corresponding to the propagation delays of various paths through which the divided clock signals travel.

In one embodiment, a circuit may be analyzed to statically predict when values of divided clocks change. Based on the prediction, period of the design clock is adjusted to account for propagation of the change in the divided clocks. For example, the design clock may have a long period corresponding to a signal path through which the change in a divided clock is propagated. The design clock may also have a short period when divided clocks do not change values. In general, if a derived clock (e.g., a divided clock, gated clock, or any other kind of derived clock) has a long propagation delay, transitions on the derived clock may be detected/predicted by analyzing the design. Therefore, the design clock can adapt to a shorter period when there is no transition on the derived clock, and adapt to a longer period when there is a transition on the derived clock.

Figure 6:
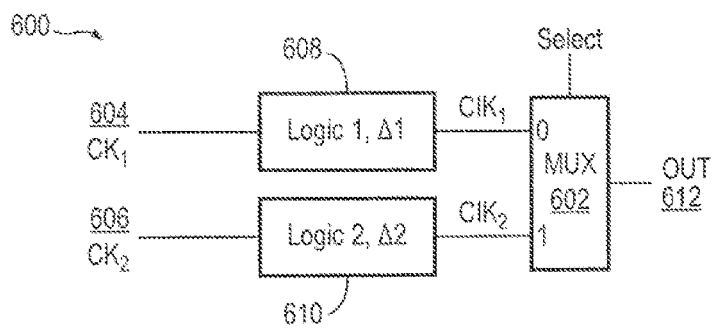
FIG. 6 illustrates an exemplary multiplexer selecting between two clock signals, according to one embodiment of the present invention.

In one embodiment, a variable period clock signal may be used to evaluate a design that includes clock multiplexers. For example, a variable speed clock signal may be used when multiplexing between several clock signals in the design. FIG. 6 illustrates an exemplary multiplexer circuit selecting between two different clock signals. Clock signal clk1 is shown to be derived from clock signal ck1. Similarly, clock signal clk2 is shown to be derived from clock signal ck2. Propagation delay of combinational logic 608 is represented by $\Delta_1$, and propagation delay of combinational logic 610 is represented by $\Delta_2$, in which $\Delta_1 \neq \Delta_2$. A conservative solution may define period of the design clock based on the maximum of the two propagation delays $\Delta_1$ and $\Delta_2$. However, according to one embodiment, emulation speed is accelerated by using a variable period clock signal for the design. As an example, the design clock signal may be defined to change dynamically during emulation, as follows:

when select is 0, period of the design clock is defined based on propagation delay $\Delta_1$.

when select is 1, period of the design clock is defined based on propagation delay $\Delta_2$.

Therefore, in one embodiment, a state machine may be constructed that dynamically controls frequency of the design clock at different times. Using a variable period clock in hardware emulation is advantageous when a reset sequence is done using a slower clock, that is followed by a switch to a faster clock. This still conforms to the paradigm when execution of a design cycle would take variable number of emulation hardware clock cycles.

Certain embodiments take advantage of waveforms of one or more divided clocks and/or propagation delays of the divided clocks in a DUT, in order to dynamically change frequency of the design clock based on the frequency of the divided clocks and/or propagation delay of the divided clock paths.

As mentioned before, in one embodiment, global speed of hardware emulation is accelerated by taking advantage of clock tree analysis of the design (e.g., finding propagation delay of different paths) and of waveforms of the clocks. Given the fact that some design clock cycles need to be emulated in longer time frames than other clock cycles, the relationship between frequent and infrequent clock signals in the hardware design is obtained from the designed circuit. Alternatively, the relationship between different clock signals may be provided to the emulation system as an additional user input.

One embodiment of the present invention dynamically determines whether there is a concurrent change in both the design and divided clocks, and slows the cycle speed of the design clock, if necessary. The cycle speed is then changed so as to speed up the clock if a given event on the design clock signal does not result in a change in the divided clock signal. A variable period clock may be used for emulating/prototyping a DUT with any number of derived and/or multiplexed clock signals. In general any number of dividers, gates, multiplexers, and or other operators may operate on clock signals in a design that is analyzed as described herein, without departing from teachings of the present disclosure.

As described herein, emulating different cycles of the design clock can correspond to different number of cycles of the system clock in an emulation system (e.g., variable period design clock). The variable period design clock, in one embodiment, can be defined to correspond to one or more divided clocks, multiplexed clocks or any event or application that affects the clock signal. As an example, a variable period clock may be used in a design that has instrumentation for low power.

In one embodiment, a design can be divided into two or more different domains. At each point in time, some of the domains may be turned on and the rest of the domains may be off to save power. Without loss of generality, assume that the critical path passes through a first domain of the design. Originally, period of the design clock is defined based on propagation of signals through the critical path of the design. In order to reduce power consumption of the design, if the first domain of the design is not in use, its corresponding power can be turned off. Conventionally, even after deactivating the circuit elements in the first domain, emulation continues with the same clock period corresponding to the original critical path (which no longer is valid). However, it is possible to run the design with a faster clock when the first domain is turned off. Certain embodiments adjust the period of the design clock to a shorter period (e.g., corresponding to a second critical path based on the domains that are still active) when the first domain—through which the original critical path passes—is turned off. In addition, when power for the first domain is turned back on, period of the design clock may be adjusted to the original, longer period corresponding to the original critical path.

Figure 7:
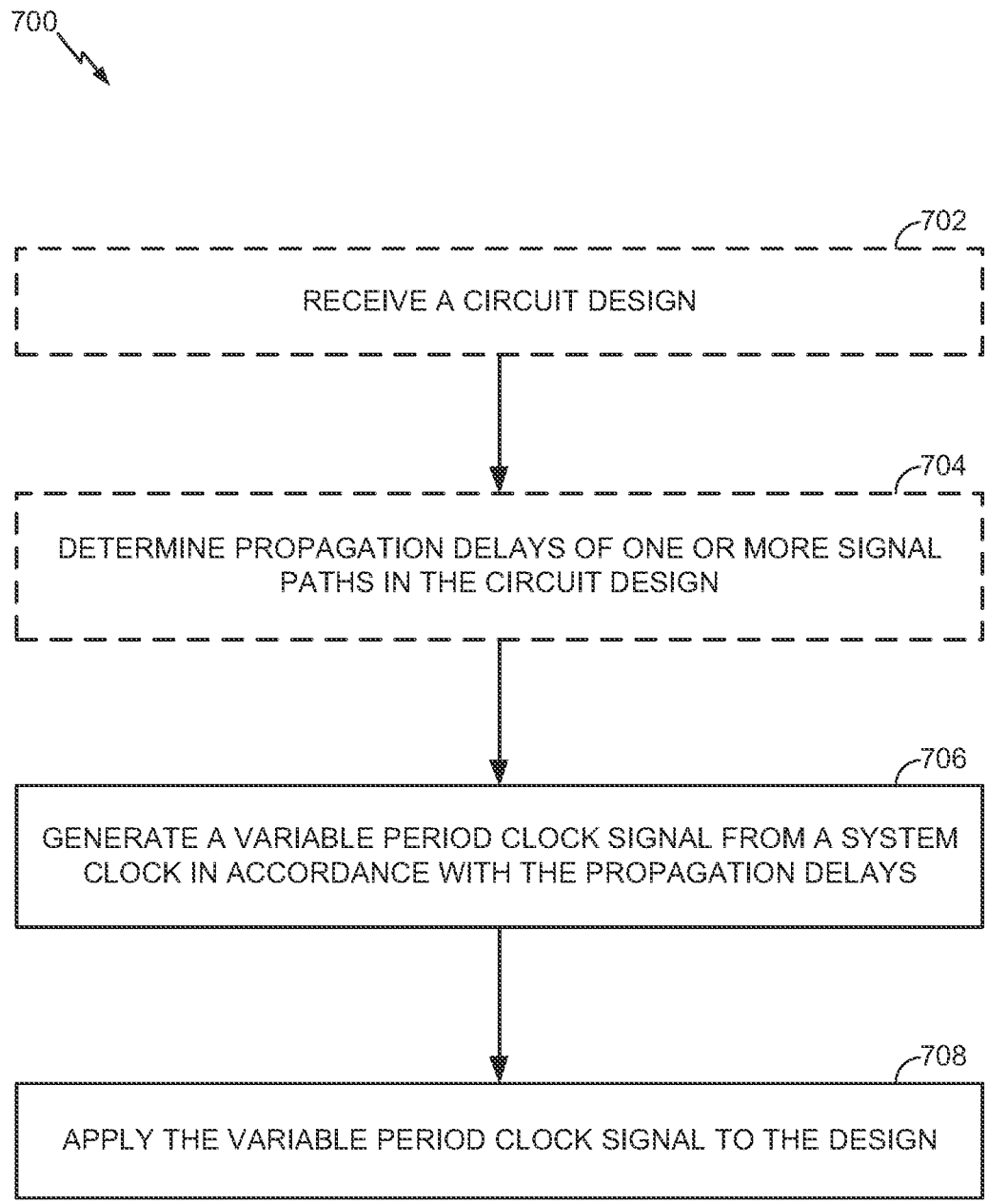
FIG. 7 is a flow chart that may be performed by a device to emulate a circuit, according to one embodiment of the present invention.

FIG. 7 is a flow chart 700 performed by a device to emulate a circuit design, in accordance with some embodiments of the present invention. At 702, the device receives the circuit design. Alternatively, the device retrieves the circuit design from its memory. At 704, the device determines propagation delay of one or more signal paths in the circuit design. At 706, a variable period clock is generated from a system clock in accordance with the propagation delays. The variable period clock signal has a first period and a second period greater than the first period. The first period occurs in each N cycles of the system clock and the second period occurs in each M cycles of the system clock. In one embodiment, the second period is defined by the propagation delays of signal paths of the design. At 708, the device applies the variable period clock signal to the design. In one embodiment, the device analyzes the design to determine the one or more propagation delay values corresponding to one or more signals in the design. For example, the propagation delay of signals that are passed through dividers and/or multiplexers are determined and used in generation of the variable period clock signal.

Figure 8:
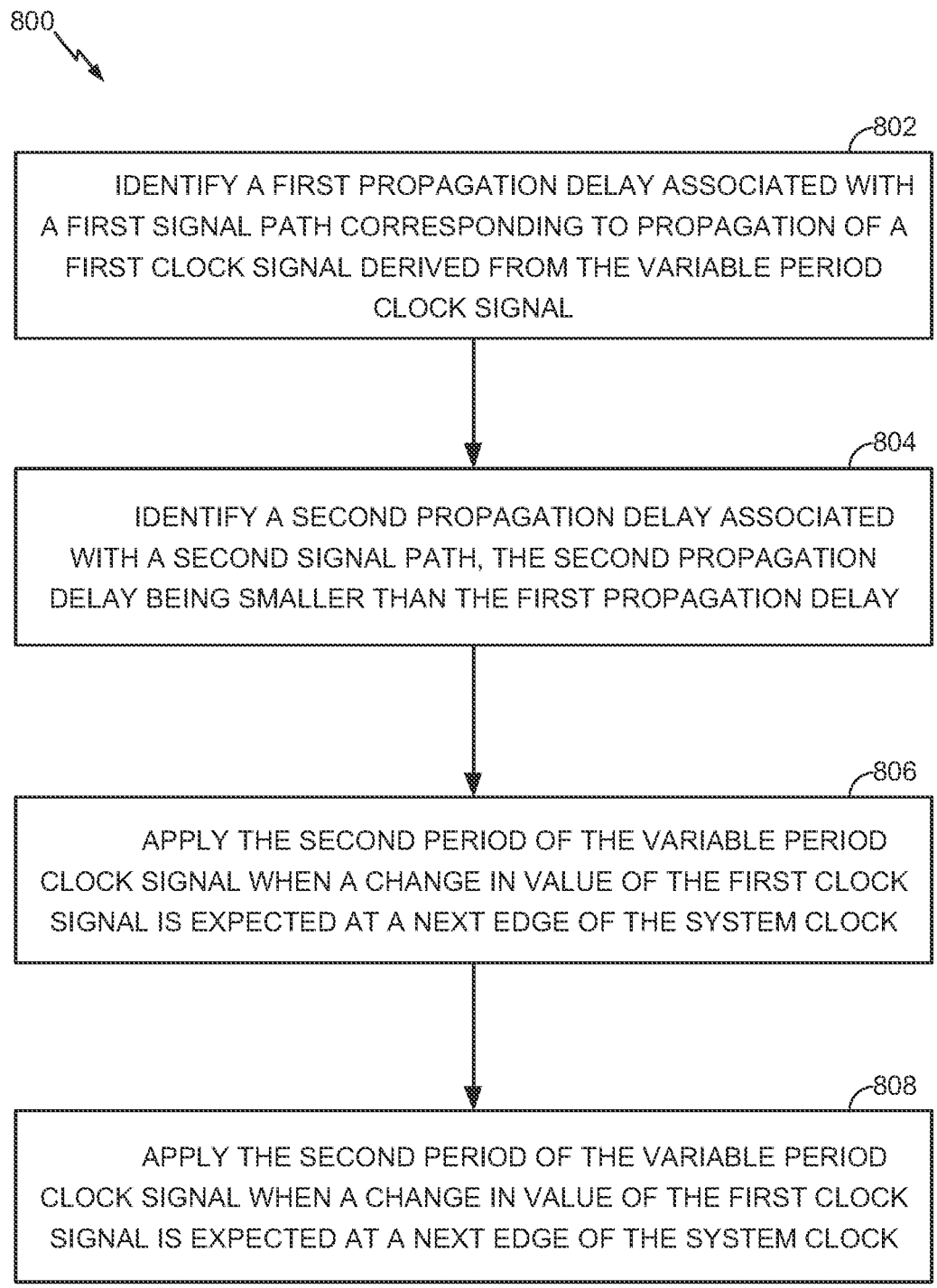
FIG. 8 illustrates an exemplary flow chart for defining one of the periods of a variable period clock signal, according to one embodiment of the present invention.

FIG. 8 illustrates an exemplary flow chart 800 for defining one of the periods of a variable period clock signal, in accordance with an embodiment. At 802, the device identifies a first propagation delay associated with a first signal path corresponding to propagation of a first clock signal derived from the variable period clock signal. At 804, the device identifies a second propagation delay associated with a second signal path, the second propagation delay being smaller than the first propagation delay. At 806, the device applies the second period of the variable period clock signal when a change in value of the first clock signal is expected at a next edge of the system clock. The second period of the variable period clock signal is defined in accordance with the first propagation delay. At 808, the device applies the first period of the variable period clock signal when a change in value of the first clock signal is not expected at the next edge of the system clock. The first period of the variable period clock signal is defined in accordance with the second propagation delay. In one embodiment, the first propagation delay corresponds to a maximum clock propagation delay in a circuit design and the second propagation delay is smaller than the first propagation delay and larger than any other clock propagation delay in the circuit design.

Figure 9:
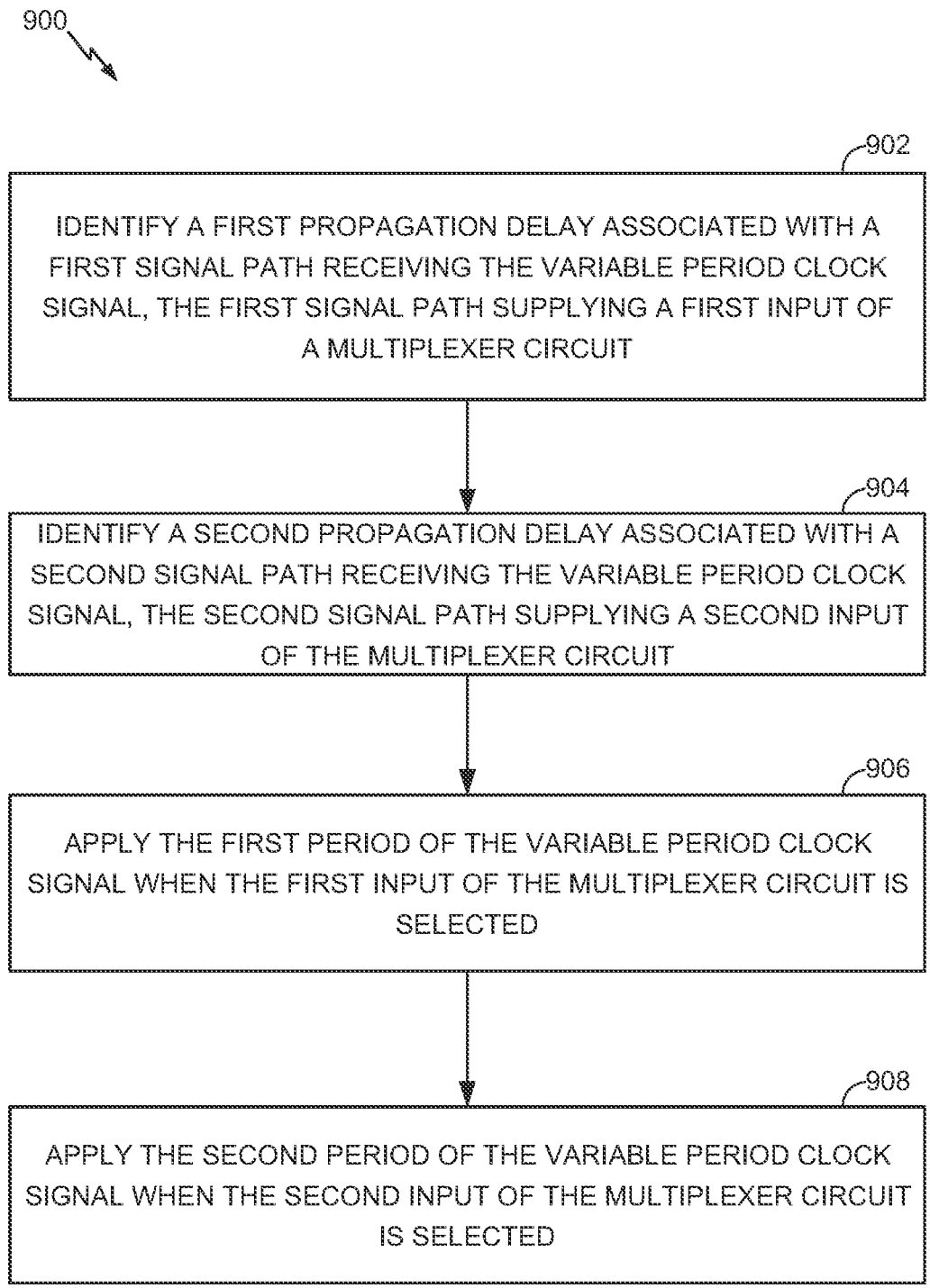
FIG. 9 illustrates another exemplary flow chart for defining one of the periods of a variable period clock signal, according to one embodiment of the present invention.

FIG. 9 illustrates another exemplary flow chart 900 for defining one of the periods of a variable period clock signal, in accordance with an embodiment. At 902, the device identifies a first propagation delay associated with a first signal path receiving the variable period clock signal. At 904, the device identifies a second propagation delay associated with a second signal path receiving the variable period clock signal. The first signal path signal path supplies a first input of a multiplexer circuit and the second signal path supplies a second input of the multiplexer circuit. At 906, the device applies the first period of the variable period clock signal when the first input of the multiplexer circuit is selected, wherein the first period of the variable period clock signal is defined in accordance with the first propagation delay. At 908, the device applies the second period of the variable period clock signal when the second input of the multiplexer circuit is selected, wherein the second period of the variable period clock signal is defined in accordance with the second propagation delay.

In one embodiment, an emulation system is disclosed that generates a variable period design clock. In general, length of different periods of the variable period design clock can change dynamically. For example, length of the different periods of the variable period design clock can vary from one design clock period to another. In one embodiment, a dynamic mechanism (that operates during the emulation of the design) can be built into the emulation system that can trigger an indication that it is already safe to start emulation of next design cycle. In one example scenario, if none of the values in the design are expected to change in the remaining part of the design cycle, the next cycle can be initiated. As a result, the emulation system can start the next design clock cycle possibly as soon as receiving the indication.

Figure 10:
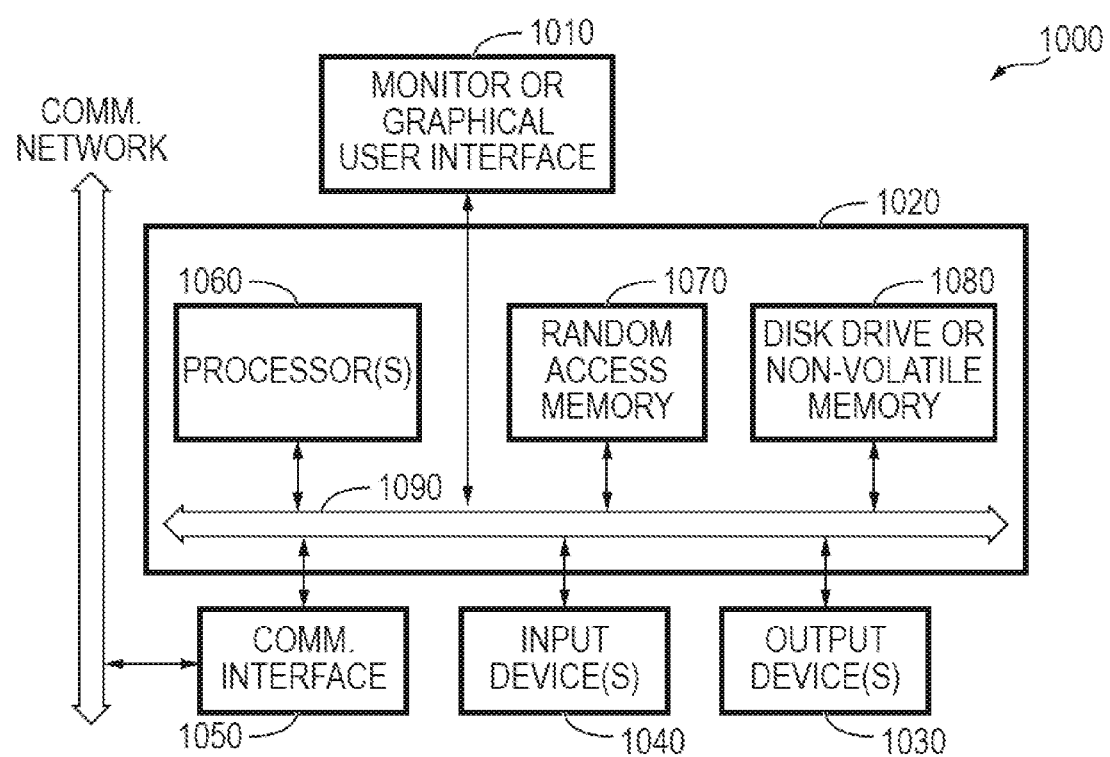
FIG. 10 is an example block diagram of a computer system that may incorporate embodiments of the present invention.

FIG. 10 is an example block diagram of a computer system that may incorporate embodiments of the present invention. FIG. 10 is merely illustrative of an embodiment incorporating the present invention and does not limit the scope of the invention as recited in the claims. One of ordinary skill in the art would recognize other variations, modifications, and alternatives. In one embodiment, computer system 1000 typically includes a monitor 1010, a computer 1020, user output devices 1030, user input devices 1040, communications interface 1050, and the like.

As shown in FIG. 10, computer 1020 may include a processor(s) 1060 that communicates with a number of peripheral devices via a bus subsystem 1090. These peripheral devices may include user output devices 1030, user input devices 1040, communications interface 1050, and a storage subsystem, such as random access memory (RAM) 1070 and disk drive 1080.

User input devices 1030 include all possible types of devices and mechanisms for inputting information to computer system 1020. These may include a keyboard, a keypad, a touch screen incorporated into the display, audio input devices such as voice recognition systems, microphones, and other types of input devices. In various embodiments, user input devices 1030 are typically embodied as a computer mouse, a trackball, a track pad, a joystick, wireless remote, drawing tablet, voice command system, eye tracking system, and the like. User input devices 1030 typically allow a user to select objects, icons, text and the like that appear on the monitor 1010 via a command such as a click of a button or the like.

User output devices 1040 include all possible types of devices and mechanisms for outputting information from computer 1020. These may include a display (e.g., monitor 1010), non-visual displays such as audio output devices, etc.

Communications interface 1050 provides an interface to other communication networks and devices. Communications interface 1050 may serve as an interface for receiving data from and transmitting data to other systems. Embodiments of communications interface 1050 typically include an Ethernet card, a modem (telephone, satellite, cable, ISDN), (asynchronous) digital subscriber line (DSL) unit, FireWire interface, USB interface, and the like. For example, communications interface 1050 may be coupled to a computer network, to a FireWire bus, or the like. In other embodiments, communications interfaces 1050 may be physically integrated on the motherboard of computer 1020, and may be a software program, such as soft DSL, or the like.

In various embodiments, computer system 1000 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1020 includes one or more Xeon microprocessors from Intel as processor(s) 1060. Further, one embodiment, computer 1020 includes a UNIX-based operating system.

RAM 1070 and disk drive 1080 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1070 and disk drive 1080 may be configured to store the basic programming and data constructs that provide the functionality of the present invention.

Software code modules and instructions that provide the functionality of the present invention may be stored in RAM 1070 and disk drive 1080. These software modules may be executed by processor(s) 1060. RAM 1070 and disk drive 1080 may also provide a repository for storing data used in accordance with the present invention.

RAM 1070 and disk drive 1080 may include a number of memories including a main random access memory (RAM) for storage of instructions and data during program execution and a read only memory (ROM) in which fixed non-transitory instructions are stored. RAM 1070 and disk drive 1080 may include a file storage subsystem providing persistent (non-volatile) storage for program and data files. RAM 1070 and disk drive 1080 may also include removable storage systems, such as removable flash memory.

Bus subsystem 1090 provides a mechanism for letting the various components and subsystems of computer 1020 communicate with each other as intended. Although bus subsystem 1090 is shown schematically as a single bus, alternative embodiments of the bus subsystem may utilize multiple busses.

FIG. 10 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. For example, the variable period clock signal may have any number of periods without departing from the teachings of the present disclosure. In addition, similar principles as described corresponding to dividers and multiplexers can be applied to other circuit elements. Other modifications and variations will be apparent to those skilled in the art and are intended to fall within the scope of the appended claims.

What is claimed is:

1. A hardware verification system comprising a plurality of programmable devices and a system clock, the hardware verification system configured to:
generate a variable period clock signal from the system clock, the variable period clock signal having a first period during a first time interval and a second period during a second time interval, wherein said second period is greater than the first period, said first period occurring in each N cycles of the system clock and said second period occurring in each M cycles of the system clock, wherein N and M are integer values greater than zero;
apply the variable period clock signal to at least a first subset of the plurality of programmable devices;

identify a first propagation delay associated with a first signal path corresponding to propagation of a first clock signal derived from the variable period clock signal;

identify a second propagation delay associated with a second signal path, the second propagation delay being smaller than the first propagation delay;

apply the second period of the variable period clock signal when a change in value of the first clock signal is expected at a next edge of the system clock, wherein the second period of the variable period clock signal is defined in accordance with the first propagation delay; and apply the first period of the variable period clock signal when a change in value of the first clock signal is not expected at the next edge of the system clock, wherein the first period of the variable period clock signal is defined in accordance with the second propagation delay.

2. The hardware verification system of claim 1, wherein said hardware verification system is further configured to receive a circuit design and to determine the second period in accordance with a propagation delay of a signal path of the circuit design.

3. The hardware verification system of claim 1, wherein the first propagation delay corresponds to a maximum clock propagation delay in a circuit design and the second propagation delay is smaller than the first propagation delay and larger than any other clock propagation delay in the circuit design.

4. The hardware verification system of claim 1, wherein the first propagation delay is associated with a logic receiving a clock signal generated by dividing the variable period clock signal.

5. A hardware verification system comprising a plurality of programmable devices and a system clock, the hardware verification system configured to:
generate a variable period clock signal from the system clock, the variable period clock signal having a first period during a first time interval and a second period during a second time interval, wherein said second period is greater than the first period, said first period occurring in each N cycles of the system clock and said second period occurring in each M cycles of the system clock, wherein N and M are integer values greater than zero;

apply the variable period clock signal to at least a first subset of the plurality of programmable devices;

identify a first propagation delay associated with a first signal path receiving the variable period clock signal, the first signal path supplying a first input of a multiplexer circuit;

identify a second propagation delay associated with a second signal path receiving the variable period clock signal, the second signal path supplying a second input of the multiplexer circuit;

apply the first period of the variable period clock signal when the first input of the multiplexer circuit is selected, wherein the first period of the variable period clock signal is defined in accordance with the first propagation delay; and apply the second period of the variable period clock signal when the second input of the multiplexer circuit is selected, wherein the second period of the variable period clock signal is defined in accordance with the second propagation delay.

6. The hardware verification system of claim 1, wherein the hardware verification system is a hardware emulator.

7. The hardware verification system of claim 1, wherein the hardware verification system comprises an array of field programmable gate arrays (FPGAs).

8. The hardware verification system of claim 1, wherein said hardware verification system is further configured to:
receive an indication that values in the design do not expect to change in the remaining part of a design cycle; and start a new cycle of the variable period design clock in response to the indication.

9. A method of verifying a design using a plurality of programmable devices and a system clock, the method comprising:
causing a variable period clock signal to be generated from the system clock when the design is received by the plurality of programmable devices, said variable period clock having a first period during a first time interval, and a second period during a second time interval, wherein said second period is greater than the first period, said first period occurring in each N cycles of the system clock and said second period occurring in each M cycles of the system clock, wherein N and M are integer values greater than zero;

identifying a first propagation delay associated with a first signal path corresponding to propagation of a first clock signal derived from the variable period clock signal;

identifying a second propagation delay associated with a second signal path, the second propagation delay being smaller than the first propagation delay;

applying the second period of the variable period clock signal when a change in value of the first clock signal is expected at a next edge of the system clock, wherein the second period of the variable period clock signal is defined in accordance with the first propagation delay; and applying the first period of the variable period clock signal when a change in value of the first clock signal is not expected at the next edge of the system clock, wherein the first period of the variable period clock signal is defined in accordance with the second propagation delay.

10. The method of claim 9, further comprising:
applying the variable period clock signal to at least a first one of the plurality of programmable devices to verify the design.

11. The method of claim 9, further comprising:
receiving a circuit design; and
determining the second period based on a propagation delay of a signal path of the circuit design.

12. The method of claim 9, wherein the first propagation delay corresponds to a maximum clock propagation delay in the design, and the second propagation delay is smaller than the first propagation delay and larger than any other clock propagation delay in the design.

13. The method of claim 9, wherein the first propagation delay is associated with a logic receiving a clock signal generated by dividing the variable period clock signal.

14. A method of verifying a design using a plurality of programmable devices and a system clock, the method comprising:
causing a variable period clock signal to be generated from the system clock when the design is received by the plurality of programmable devices, said variable period clock having a first period during a first time interval, and a second period during a second time interval, wherein said second period is greater than the first period, said first period occurring in each N cycles of the system clock and said second period occurring in each M cycles of the system clock, wherein N and M are integer values greater than zero;

identifying a first propagation delay associated with a first signal path receiving the variable period clock signal, the first signal path supplying a first input of a multiplexer circuit;

identifying a second propagation delay associated with a second signal path receiving the variable period clock signal, the second signal path supplying a second input of the multiplexer circuit;

applying the first period of the variable period clock signal when the first input of the multiplexer circuit is selected, wherein the first period of the variable period clock signal is defined in accordance with the first propagation delay; and applying the second period of the variable period clock signal when the second input of the multiplexer circuit is selected, wherein the second period of the variable period clock signal is defined in accordance with the second propagation delay.

15. The method of claim 9, wherein said verifying is performed on a hardware emulation board.

16. The method of claim 9, wherein said programmable devices are field programmable gate arrays (FPGAs).

17. An apparatus for verifying a design using a plurality of programmable devices and a system clock, comprising:

means for causing a variable period clock signal to be generated from the system clock when the design is received by the plurality of programmable devices, said variable period clock having a first period during a first time interval and a second period during a second time interval, wherein said second period is greater than the first period, said first period occurring in each N cycles of the system clock and said second period occurring in each M cycles of the system clock, wherein N and M are integer values greater than zero;

means for applying the variable period clock signal to at least a first one of the plurality of programmable devices to verify the design;

means for identifying a first propagation delay associated with a first signal path corresponding to propagation of a first clock signal derived from the variable period clock signal;

means for identifying a second propagation delay associated with a second signal path, the second propagation delay being smaller than the first propagation delay;

means for applying the second period of the variable period clock signal when a change in value of the first clock signal is expected at a next edge of the system clock, wherein the second period of the variable period clock signal is defined in accordance with the first propagation delay; and means for applying the first period of the variable period clock signal when a change in value of the first clock signal is not expected at the next edge of the system clock, wherein the first period of the variable period clock signal is defined in accordance with the second propagation delay.

18. The apparatus of claim 17, further comprising:

means for receiving a circuit design; and means for determining the second period based on a propagation delay of a signal path of the circuit design.

19. The apparatus of claim 17, wherein the first propagation delay corresponds to a maximum clock propagation delay in the design, and the second propagation delay is smaller than the first propagation delay and larger than any other clock propagation delay in the design.

20. The apparatus of claim 17, wherein the first propagation delay is associated with a logic receiving a clock signal generated by dividing the variable period clock signal.

21. An apparatus for verifying a design using a plurality of programmable devices and a system clock, comprising:

means for causing a variable period clock signal to be generated from the system clock when the design is received by the plurality of programmable devices, said variable period clock having a first period during a first time interval and a second period during a second time interval, wherein said second period is greater than the first period, said first period occurring in each N cycles of the system clock and said second period occurring in each M cycles of the system clock, wherein N and M are integer values greater than zero;

means for applying the variable period clock signal to at least a first one of the plurality of programmable devices to verify the design;

means for identifying a first propagation delay associated with a first signal path receiving the variable period clock signal, the first signal path supplying a first input of a multiplexer circuit;

means for identifying a second propagation delay associated with a second signal path receiving the variable period clock signal, the second signal path supplying a second input of the multiplexer circuit;

means for applying the first period of the variable period clock signal when the first input of the multiplexer circuit is selected, wherein the first period of the variable period clock signal is defined in accordance with the first propagation delay; and means for applying the second period of the variable period clock signal when the second input of the multiplexer circuit is selected, wherein the second period of the variable period clock signal is defined in accordance with the second propagation delay.

22. The apparatus of claim 17, wherein said verifying is performed on a hardware emulation board.

23. The apparatus of claim 17, wherein said programmable devices are field.

* * * * *